Figure 1:
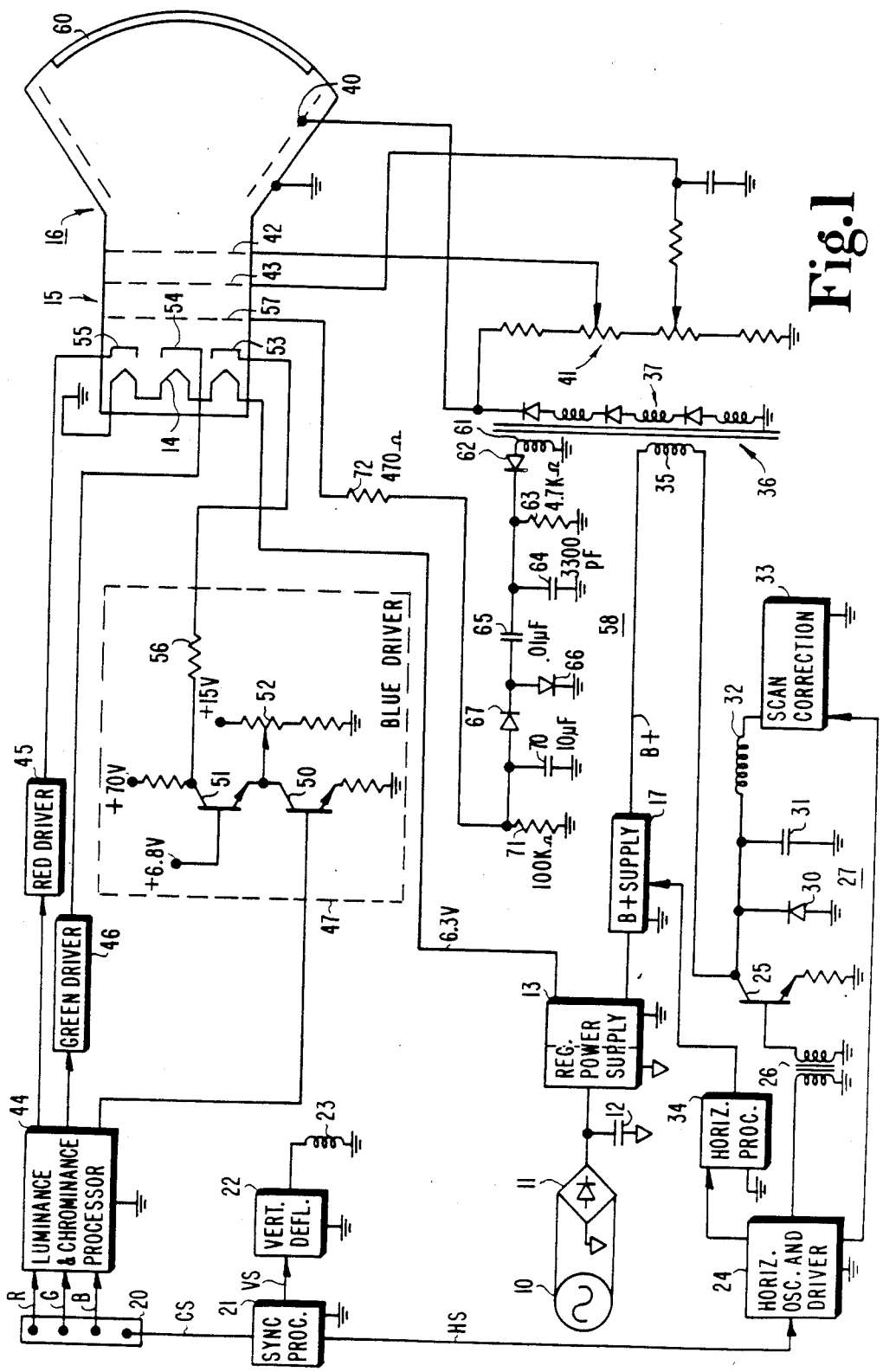

United States Patent [19]

Sendelweck

[11] Patent Number: 4,985,665

[45] Date of Patent: Jan. 15, 1991

[54] BLACK LEVEL TRACKING FOR MULTIPLE FREQUENCY APPARATUS

[75] Inventor: Gene K. Sendelweck, Indianapolis, Ind.

[73] Assignee: RCA Licensing Corporation, Princeton, N.J.

[21] Appl. No.: 220,988

[22] Filed: Jul. 18, 1988

Related U.S. Application Data

[63] Continuation of Ser. No. 897,187, Aug. 15, 1986, abandoned.

[51] Int. Cl.$^5$ ............................................. H01J 29/52
[52] U.S. Cl. ..................................... 315/386; 315/411
[58] Field of Search ...................... 315/383, 386, 411; 358/168, 169

[56] References Cited

U.S. PATENT DOCUMENTS

| | | |
|---|---|---|
| 2,993,142 | 6/1961 | Harvey . |
| 3,465,200 | 9/1969 | Higbee et al. . |
| 3,775,637 | 11/1973 | Brady . |
| 3,831,057 | 8/1974 | Meyer . |
| 3,980,822 | 9/1976 | Suzuki et al. . |

Primary Examiner—Theodore M. Blum
Attorney, Agent, or Firm—Joseph S. Tripoli; Joseph J. Laks; Sammy S. Henig

[57] ABSTRACT

A video display monitor operable at different horizontal deflection frequencies incorporates a circuit that produces an electron gun control grid potential that compensates for screen grid potential changes due to changes in operating frequency. A sawtooth signal is generated that has a peak to peak amplitude determined in response to the deflection frequency. The sawtooth signal is peak detected to produce a direct voltage, for the control grid, that varies in response to the horizontal deflection frequency.

10 Claims, 2 Drawing Sheets

BLACK LEVEL TRACKING FOR MULTIPLE FREQUENCY APPARATUS

This is a continuation of application Ser. No. 897,187, filed Aug. 15, 1986, now abandoned.

This invention relates to video display apparatus and, in particular, to video display apparatus operable at a plurality of scan or deflection frequencies.

A video display apparatus, such as a television receiver or a computer monitor, incorporates a cathode ray tube that produces one or more electron beams that are caused to be deflected or scanned in a repetitive pattern to form a raster on a phosphor display screen of the cathode ray tube. Video information is displayed on the phosphor display screen in response to modulation of the intensity of the scanned electron beams by the video information signal. The electron beam or beams are produced by an electron gun assembly that illustratively may include a cathode, a control grid, a screen grid, and an ultor or high voltage grid. The content of the video information signal controls the voltage that is applied to the cathode. The relationship between the voltages or potentials that are applied to the cathode and to the control and screen grids affect the electron beam cutoff level and characteristics in accordance with the operating specifications of the electron gun assembly. For proper video signal reproduction and color rendition, it is important that particular voltage or potential relationships between the electron gun assembly elements be maintained.

A computer monitor, for example, may be designed to be operable with more than one computer operating at different scan or deflection frequencies, or with a computer capable of operating at more than one scan frequency. As the scan frequency changes, however, the high voltage level may also change. The electron gun assembly screen grid potential, typically derived from the high voltage supply, may also change. Since the control grid voltage is typically derived from one of the regulated voltage supplies and remains constant independent of frequency, the relationship between the screen and control grid potentials will also change, resulting in an undesirable shift of the black level of the displayed video information. It is desirable that the monitor be able to operate properly "out-of-the-box" without requiring additional set-up or adjustment for particular computer frequencies or operating characteristics, and without requiring adjustment when scan frequency is changed.

In accordance with an aspect of the present invention, a video display apparatus operable at a plurality of line deflection frequencies comprises a cathode ray tube having an electron gun assembly. The electron gun assembly incorporates a control grid and a screen grid. The voltage source for the screen grid has a level that varies in response to changes in the line deflection frequency. A power supply for the control grid comprises circuitry for generating a signal having an amplitude determined in response to the line deflection frequency. Circuitry generates a direct voltage that has a level determined in response to the signal amplitude. Means apply the direct voltage to the control grid.

In the accompanying drawing, FIG. 1 is a block and schematic diagram of a portion of a video display apparatus constructed in accordance with an aspect of the present invention; and FIGS. 2a-2c illustrate waveforms associated with the circuit of FIG. 1.

Referring to FIG. 1, AC line voltage from line supply 10 is rectified by diode bridge circuit 11 and filtered by capacitor 12 to form an unregulated DC voltage that is applied to regulating power supply 13. Power supply 13, which may be a conventional switching-type supply, produces one or more regulated voltage levels. Power supply 13 is also illustratively shown as providing electrical isolation between the line supply 13 and the various load circuits of the video display apparatus.

One of the regulated voltage levels from power supply 13, of the order of 6.3 volts, is illustratively shown as being applied to the heater or filament windings 14 of an electron gun assembly 15 located within the neck of a cathode ray tube (CRT) 16. Another of the regulated voltage levels from power supply 13 is illustratively shown applied to B+ supply circuitry 17, which operates in a manner that will be explained later.

Red, green and blue color video information is applied from an external signal source, such as a computer (not shown), to the video display apparatus via a terminal strip 20. A composite synchronizing (sync) signal, comprising line, or horizontal, and field, or vertical, deflection synchronizing information. The composite sync signal is applied to a sync signal processor 21 via a conductor designated CS. The sync signal processor 21 separates the respective horizontal and vertical sync information and provides a vertical sync signal to vertical deflection circuit 22 via a conductor designated VS. Vertical deflection circuit 22 produces vertical deflection rate current in a vertical deflection winding 23 located in the vicinity of the neck of CRT 16 in order to provide vertical rate deflection of the electron beams produced by electron gun assembly 15.

The video display apparatUs of FIG. 1 is illustratively operable at a plurality of line or horizontal deflection frequencies in response to the horizontal sync information rate provided by the external signal source. The horizontal sync signal from sync signal processor 21 is applied via a conductor designated HS to horizontal oscillator and driver circuitry 24 that controls the switching rate of a horizontal output transistor 25 via a driver transformer 26. Output transistor 25 forms part of a resonant retrace horizontal circuit 27, that also includes damper diode 30, retrace capacitor 31, horizontal deflection winding 32, and scan correction circuitry 33, which illustratively operates in response to a horizontal deflection rate identifying signal from horizontal oscillator and driver circuitry 24. Switching of transistor 25 acts to produce horizontal rate deflection current in horizontal deflection winding 32, located on CRT 16, in order to deflect the electron beams from electron gun assembly 15.

Proper operation of horizontal output circuit 27 at different horizontal scan or deflection frequencies requires the B+ operating voltage to be different for different frequencies. In order to provide the proper voltage level for a given operating frequency, B+ supply circuit 17 receives an input signal from horizontal signal processing circuit 34, which illustratively comprises a pulse width modulated signal formed in response to horizontal rate information received from horizontal oscillator and driver circuit 24. The frequency-determined pulse width modulated signal from horizontal signal processing circuit 34 illustratively controls the conduction angle of a switching device of B+ supply circuit 17 in order to produce a regulated supply voltage on a conductor designated B+ that has a voltage level dependent upon the horizontal scan or deflection frequency. The frequency-dependent B+ voltage is applied to horizontal deflection output circuit 27 via primary winding 35 of high voltage transformer 36. Switching of output transistor 25 causes retrace on flyback pulses to appear across winding 35. These pulses are stepped up in voltage and rectified by high voltage winding 37 to produce a high voltage or ultor potential of the order of 23 kV that is applied to the ultor or anode terminal 40 of CRT 16 to form the accelerating potential for the electron beams from electron gun assembly 15. The high voltage level is also applied to resistor chain 41 in order to provide necessary operating potential for electron gun assembly 15. In the circuit of FIG. 1, a focus potential of the order of 6000 volts is applied to focus grid 42 of electron gun assembly 15. A screen potential of the order of +400 volts is applied to the screen grid 43 of electron gun assembly 15.

The red, green, and blue color video signal applied to terminal strip 20 are in turn applied to luminance and chrominance processing circuitry 44 along conductors designated R, G and B, respectively. The processed video signals are respectively applied to red driver circuit 45, green driver circuit 46 and blue driver circuit 47. The driver circuits 45, 46 and 47 operate in a similar manner; consequently only blue driver circuit 47 will be explained in detail. The blue signal from luminance and chrominance processing circuit 44 is applied to the base of a transistor 50 which forms a cascade arrangement with a transistor 51. Variable resistor 52 adjusts the DC bias of transistor 51. The collector terminal of transistor 51 represents the output of blue driver circuit 47 and is applied to a cathode electrode 53 of electron gun assembly 15 via a resistor 56. The cathode voltage or potential is varied in accordance with the video signal applied to the base of transistor 50. In a similar manner, green driver circuit 46 is connected to cathode electrode 54 while red driver circuit 45 is connected to cathode electrode 55.

The specification of the cathode ray tube requires certain operating ratios between the potentials applied to the cathode electrodes and various grids of the electron gun assembly, in particular, screen grid 43 and the control grid 57, located between the cathode and screen grid 43. The ratios between these voltage potential levels must be maintained in accordance with particular relationships to insure desirable operating characteristics of the CRT, such as electron beam cutoff voltages and white and block levels for the video signals.

In the video display apparatus of FIG. 1, a change in operating or deflection frequency may result in a change in the high voltage level, due to a change in the trace to retrace time relationship. As the potential for screen grid 43 is derived from the high voltage level via resistor chain 41, the screen grid potential will also change. This change in screen grid potential, absent other compensation, will disrupt the voltage relationship between the cathode, control grid and screen grid in a manner that causes a shift in the electron beam cutoff potential resulting in a black level shift of the video information displayed on the phosphor display screen 60 on the front panel of CRT 16. This is an undesirable situation, as it is desirable that the video display monitor be able to operate out-of-the-box at any of its operable frequencies or with changes in frequency, without requiring adjustment or set-up of the monitor circuits.

Figure 2:
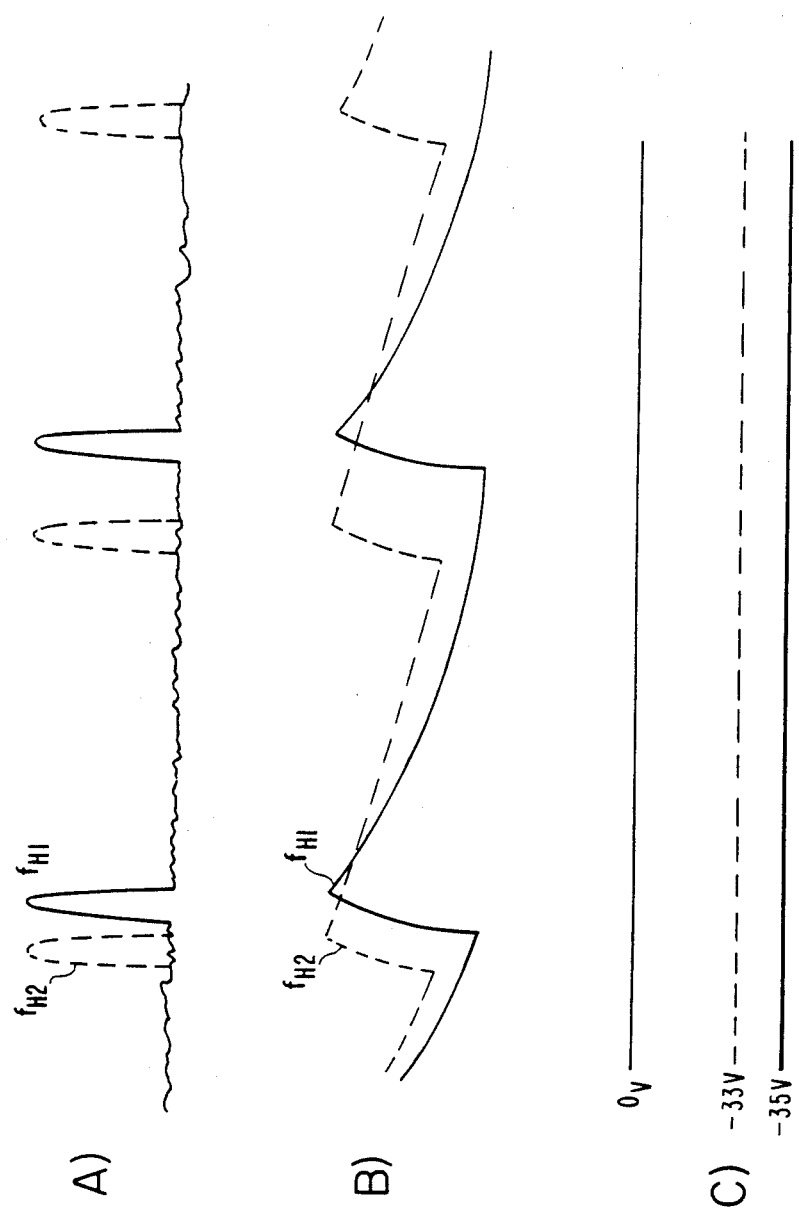

In accordance with an aspect of the present invention, the voltage potential applied to control grid 57 is adjusted in accordance with changes in the horizontal scan or deflection frequency to compensate for changes in the screen grid potential so as to maintain proper electron beam drive and cutoff characteristics. A control grid power supply 58 comprises a secondary winding 61 on transformer 36. Horizontal deflection rate retrace pulses applied to primary winding 35 causes representative pulses, shown in FIG. 2A, to appear across winding 61. In the waveforms of FIG. 2, the solid lines represent circuit operation at a first horizontal deflection rate $f_{H1}$, while the dashed lines represent operation at a second, higher frequency $f_{H2}$.

Diode 62, resistor 63 and capacitor 64 generate a sawtooth signal, as shown in FIG. 2B, from the pulses across winding 61. The component values of resistor 63 and capacitor 64 are selected such that the peak to peak amplitude of the generated sawtooth signal varies as a function of changes in horizontal deflection frequency. Capacitor 65 and diode 66 act to negatively clamp the sawtooth signal. The negatively clamped sawtooth signal is peaked detected by action of diode 67, capacitor 70, and resistor 71 to produce a negative direct voltage as shown in FIG. 2C that is determined in response to the horizontal deflection frequency. This negative direct voltage, which illustratively will vary with deflection frequency within a range of the order of −33 to −35 volts, is applied to control grid 57 via resistor 72. The range of actual voltages produced and the degree of voltage tracking correlation may be determined by the selection of the sawtooth signal generating components of control grid power supply 58.

The previously described control grid power supply of the present invention will operate in an equally desirable manner with video display monitors or apparatus that operate at a finite number of deflection frequencies or with monitors that are operable over a continuous range of frequencies.

What is claimed is:

1. A video display apparatus operable at a plurality of line deflection frequencies comprising:

a cathode ray tube comprising an electron gun assembly incorporating a control grid and incorporating a screen grid coupled to a source of potential having a level determined in response to said line deflection frequency such that a given change in said line deflection frequency causes a corresponding change in a voltage that is developed at said screen grid; and a power supply for said control grid comprising:

means for generating a signal having an amplitude dependent upon said line deflection frequency;

means responsive to said signal and coupled to said control grid for generating a direct voltage that is applied to said control grid having a predetermined level at a corresponding line deflection frequency that changes in accordance with said given change in said line deflection frequency, said direct voltage being generated in such a way that any ratio value of the change in said level of said direct voltage to said predetermined level of said direct voltage may be selected from a range of ratio values so as to compensate for said change in said voltage that is developed at said screen grid; and means for applying said direct voltage to said control grid.

2. The arrangement defined in claim 1, wherein said signal generating means comprises a sawtooth signal generating circuit.

3. The arrangement defined in claim 2, wherein said direct voltage generating means comprises a peak detector.

4. A video display apparatus operable at a plurality of line deflection frequencies comprising:
   a cathode ray tube comprising an electron gun assembly incorporating a control grid and incorporating a screen grid coupled to a source of potential having a level determined in response to said line deflection frequency; and
   a power supply for said control grid comprising:
   a sawtooth signal generating circuit for generating a sawtooth having an amplitude dependent upon said line deflection frequency;
   means for generating a direct voltage having a level determined in response to said amplitude of said sawtooth signal; and
   means for applying said direct voltage to said control grid.

5. The arrangement defined in claim 4, wherein said direct voltage generating means comprises a peak detector.

6. An apparatus according to claim 1 wherein said screen grid and direct voltages are produced in accordance with first and second retrace voltages generated in first and second windings, respectively, of a flyback transformer, wherein a peak value of said first retrace voltage varies when said change in said line deflection frequency occurs that causes said change in said screen grid voltage that requires the compensation.

7. An apparatus according to claim 1 wherein said direct voltage generating means is responsive to a retrace voltage developed in a flyback transformer for producing said direct voltage such that a change in an interval between corresponding pulses of said retrace voltage, that changes in accordance with said given change in said line deflection frequency, causes said level of said direct voltage to change.

8. An apparatus according to claim 1 wherein said direct voltage generating means comprises means responsive to a retrace voltage developed in a flyback transformer for producing a sawtooth signal having a peak-to-peak amplitude that varies when said change in said line frequency occurs and a peak-to-peak detector that generates said direct voltage in accordance with said peak-to-peak amplitude of said sawtooth signal.

9. An apparatus according to claim 8 wherein said sawtooth signal generating means comprises a capacitance coupled to a resistance and a rectifier that rectifies said retrace voltage to develop a first peak level of a voltage in said capacitance wherein said resistance discharges said capacitance during a trace interval that varies a second peak level of said voltage in said capacitance in accordance with said line deflection frequency.

10. An apparatus according to claim 1 wherein said direct voltage generating means automatically compensates for an undesirable shift of a black level of a displayed video information in said cathode ray tube when said change in said line deflection frequency occurs.

* * * * *